United States Patent [19]

Tanaka

[11] Patent Number: 5,128,515
[45] Date of Patent: Jul. 7, 1992

[54] HEATING APPARATUS

[75] Inventor: Susumu Tanaka, Hachioji, Japan

[73] Assignee: Tokyo Electron Sagami Limited, Kanagawa, Japan

[21] Appl. No.: 693,728

[22] Filed: Apr. 30, 1991

[30] Foreign Application Priority Data

May 21, 1990 [JP] Japan .................. 2-130868
May 21, 1990 [JP] Japan .................. 2-130869
May 21, 1990 [JP] Japan .................. 2-130870

[51] Int. Cl.⁵ .............................. H05B 3/64
[52] U.S. Cl. ................... 219/390; 118/725; 219/411
[58] Field of Search ........... 219/390, 405, 411; 118/724, 725

[56] References Cited

U.S. PATENT DOCUMENTS

| 2,145,324 | 1/1939 | Stauss | 219/390 |
| 2,969,412 | 1/1961 | Frank | 219/390 |
| 3,387,078 | 6/1968 | Montgomery | 219/390 |
| 3,804,967 | 4/1974 | Werych | 219/390 |
| 4,081,313 | 3/1978 | McNeilly | 118/725 |
| 4,348,580 | 9/1982 | Drexel | 219/390 |
| 4,699,084 | 10/1987 | Wilson | 219/390 |
| 5,001,327 | 3/1991 | Hirasawa | 219/390 |

FOREIGN PATENT DOCUMENTS

| 53-40761 | 10/1978 | Japan . |
| 53-48589 | 11/1978 | Japan . |
| 58-31282 | 2/1983 | Japan . |
| 60-31259 | 9/1985 | Japan . |
| 60-246582 | 12/1985 | Japan . |
| 61-89800 | 6/1986 | Japan . |
| 1-114032 | 5/1989 | Japan . |

Primary Examiner—Teresa J. Walberg
Attorney, Agent, or Firm—Oblon, Spivak, McClelland, Maier & Neustadt

[57] ABSTRACT

A heating apparatus comprising a refractory block in which coil heater is embedded, an inner metal cover located outside the refractory block, a water cooling pipe located outside the inner cover, an outer metal cover located outside the water cooling pipe, a terminal electrically connected to end of the coil heater and passed through the inner and outer covers, and a power supply electrically connected to the terminals to supply current to the coil heaters. Each of the terminals is fixed to the outer cover by insulating members but left free from the inner cover.

14 Claims, 16 Drawing Sheets

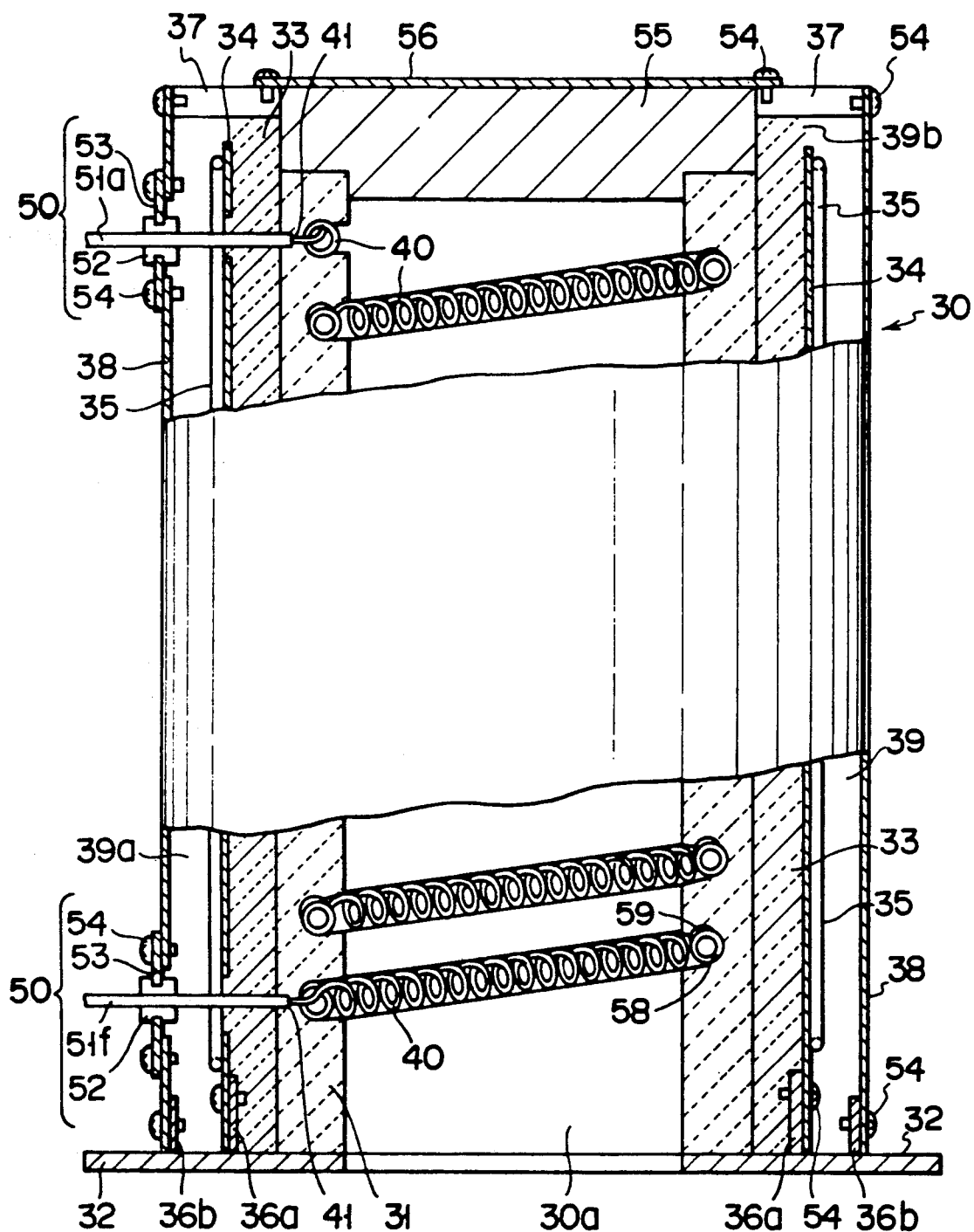
F I G. 4

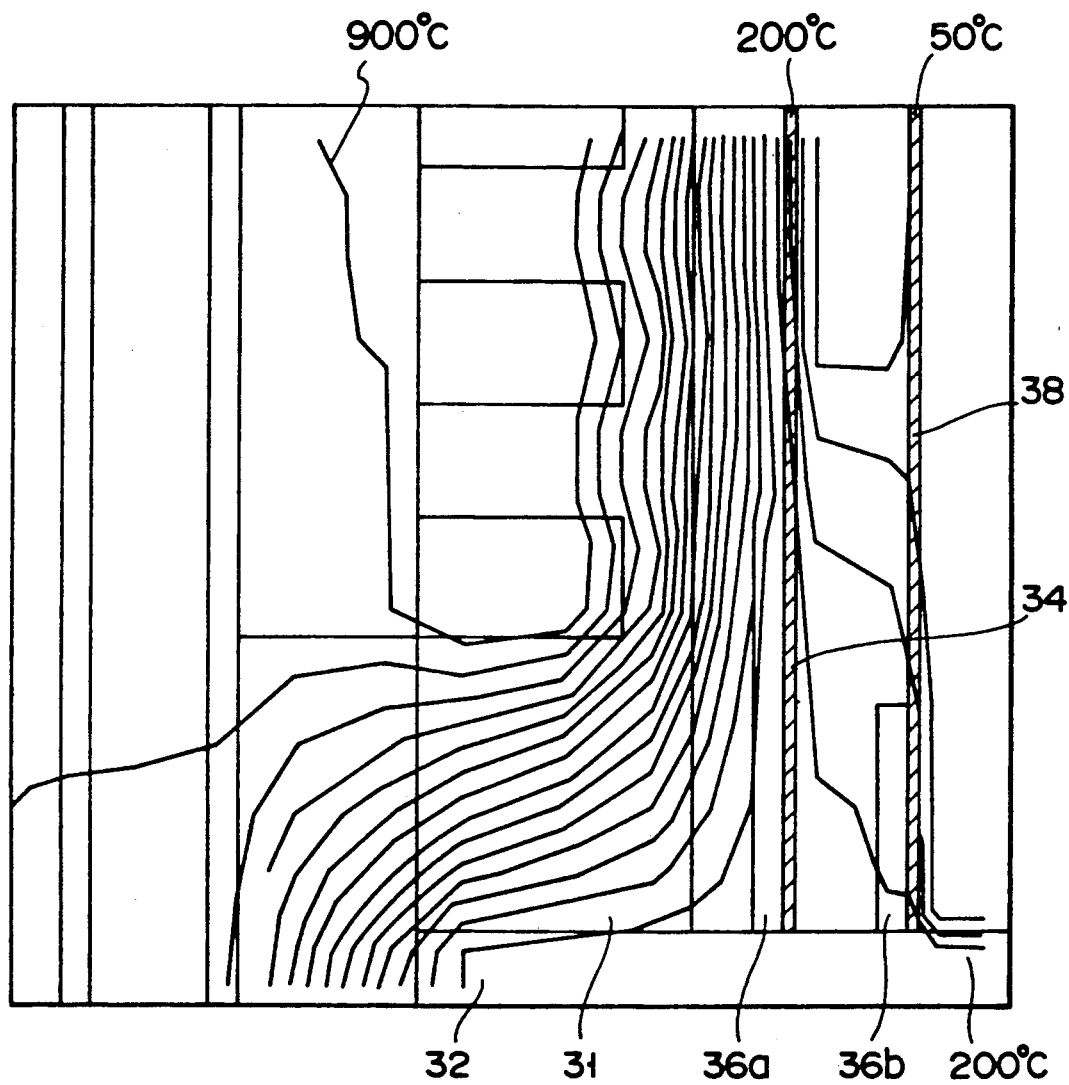
F I G. 10

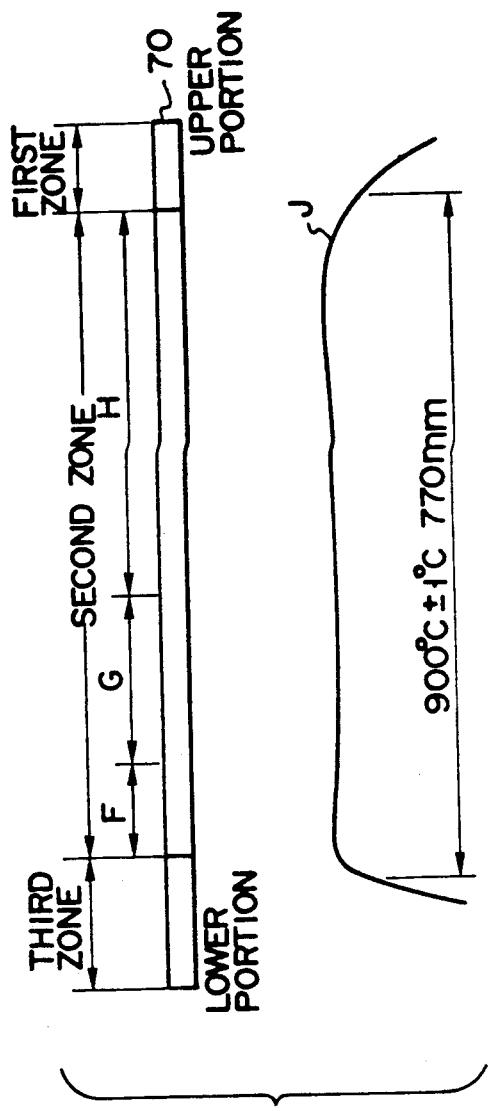
F I G. 11

HEATING APPARATUS

BACKGROUND OF THE INVENTION

1. Field of the Invention

The present invention relates to a structure of a heating section in a heating apparatus and, more particularly, it relates to an improvement of those portions at which heating elements for heating a process tube in a CVD apparatus, for example, are connected to terminals.

The heater formed by coiling resistance heating elements (which will be hereinafter referred to as "coil heater") is used at the heating section in various heating apparatuses. Generally, a coil heater having a large diameter and a large heat capacity is used for a high temperature heating apparatus but it is small in diameter and heat capacity is used for the high temperature heating apparatus. The highest temperature allowed particularly in the CVD apparatus, for example, is 1000° C. or more or less and the coil heater formed by an element of FeCrAl alloy whose diameter is 2 mm is therefore used for the CVD apparatus.

In the case of the CVD apparatus, for example, ON/OFF of current supply are frequently repeated to successively process batches of plural semiconductor wafers. The coil heater of small diameter is therefore likely to be broken because it is expanded and contracted by the heating cycles. This causes its life to be shortened. The breakdown of a coil heater is frequently caused particularly at connected portions of a terminal and the coil heater because a temperature gradient is large at the terminal, and the terminal is so shaped as to allow local stress concentration on them.

Japanese Utility Model Publication Sho 53-40761 discloses a heating apparatus wherein a buffer arm is attached to the terminal, through which current is supplied to the coil heater, to absorb the strain of the terminal caused by the heat expansion of the coil heater. In the case of this apparatus, however, heat deformation caused at the terminal can be absorbed by the buffer arm but those caused at the other portions cannot be absorbed by it. The coil heater is therefore likely to be fatigued not to fully prevent breakdown of coil heater.

Japanese Patent Disclosure Sho 58-31282 discloses an electric furnace having a heat loss preventing block arranged between an opening through which the terminal for supplying current to the coil heater and a quartz pipe. In the case of this electric furnace, the heat loss preventing block is located between the opening and the quartz pipe to prevent heat loss through the opening of the furnace body, so that a length of the uniform temperature zone in the heating apparatus can be made long. However, the opening and its vicinity are made high in temperature because of heat energy radiated through the heated quartz pipe and heat energy transmitted from the heat loss preventing block. When the inside of the furnace is heated to about 1000° C., for example, the outer wall of the furnace body and the opening and its vicinity thereof are heated to a temperature higher than 300° C. The cooling fan and the heat exchanger must be therefore added to prevent the whole of the furnace from being excessively heated, thereby causing the whole of the furnace to be large-sized.

Japanese Utility Model Publication Sho 53-48589 discloses a heating apparatus having an intermediate casing in which a heat element is arranged an outer casing located outside the intermediate casing, and a means for supplying cooling air between the intermediate and the outer casing. This apparatus has no specific cooling means at the heating section. When the inside of the apparatus is heated to about 1000° C., for example, therefore, the temperature of the heater base and the outer wall for the horizontal-type pipe-shaped heaters are elevated to about 300° C. In order to eliminate heat from these components, the three horizontal-type pipe-shaped heaters are thus enclosed by an inner casing and cooling air is supplied along the outer face of the inner casing. As the result, the heating apparatus becomes complicated and large-sized as a whole.

Japanese Utility Model Publication Sho 60-31259 discloses a heating apparatus wherein an electrically insulating bushing is interposed between a cartridge heater and a support to prevent current from being leaked from the power source to ground through a heater case. It is needed in this apparatus that insulating members such as the insulating plate and bushing are used at various portions to insulate the cartridge heater from the support. This makes the attaching of the cartridge heater complicated. Further, when the heater is to be made smaller-sized, the insulating member must be attached to the high temperature portion of the heater case. This makes it impossible to obtain a desired insulation resistance, so that current leakage cannot be fully prevented.

Japanese Patent Disclosure Hei 1-114032 discloses a heating apparatus wherein the winding density of a coil heater is made higher at a center zone in the horizontal-type ring-shaped furnace than those at both side zones thereof. When the inner diameter of the heating section in the apparatus is changed, the length of the process tube inserted into the apparatus is changed, or a heat shielding means at the furnace opening in the apparatus is changed, it is needed in the case of this apparatus that the winding density of the coil heater at the center zone is optionally set in the range of 5-15%.

Japanese Utility Model Disclosure Sho 61-89800 discloses a heating apparatus wherein a coil heater is held in a rectangular hole of a cylindrical member which is formed by two halves each having a groove-like recess on the inner face thereof and made of ceramics. In the case of this apparatus, several hundred sets of the coil heater support members each of which is a cylindrical member formed by the two recessed halves are provided to keep a predetermined winding pitch of the coil heater unchanged even when the coil heater is repeatedly expanded and contracted every time current supply is started and stopped. Every time the winding density of the coil heater is changed, therefore, several hundred sets of the support members whose dimension is different from that of the previous ones must be used These support members are complicated in shape and have a high cost and a long time is thus needed to make one set of the support members.

Japanese Patent Disclosure Sho 60-246582 discloses a heating apparatus of the composite type wherein a coil heater of small diameter is embedded in refractory ceramics. When a plurality of heating units each of which comprises the coil heater and the refractory ceramics are piled one upon an other, the heating apparatus can form the equally-heated section at a desired area. In order to increase the length of uniform temperature zone in the apparatus, however, a plurality of the heating zones or 10 heating zones, for example, must be provided. When temperature is independently controlled at each of the heating zones, therefore, the adjacent heating zones interact with each other and temperature thus fluctuates at each of the heating zones, thereby making it difficult to stably control temperature.

Further, a metal cover encloses the refractory ceramics and current supply terminals are attached to this metal cover. The metal cover is made of aluminium, for example. When those portions of the metal cover to which the current supply terminals are attached are made high in temperature, local stress is caused at connecting portions of the coil heater at the terminals to which ends of are connected, because of thermal expansion difference between the aluminium cover (whose thermal expansion coefficient is about $16 \times 10^{-6}/K$) and the refractory ceramics (whose thermal expansion coefficient is about $0.5 \times 10^{-6}/K$). Breakdown is thus caused at these connecting portions.

SUMMARY OF THE INVENTION

An object of the present invention is therefore to provide a heating apparatus capable of preventing coil heaters from being separated from current supply terminals at their connecting portions.

Another object of the present invention is to provide a heating apparatus, small in size, simple in structure and capable of eliminating heat from an outer wall and an open end of the heating section and effectively reducing current leakage A further object of the present invention is to provide a heating apparatus capable of making it unnecessary to use heater support members of high cost, more simply and easily changing the winding density of each of the coil heaters and obtaining a desired temperature distribution characteristic.

According to an aspect of the present invention, there can be provided a heating apparatus comprising a refractory block member provided with heating element enclosing objects to be processed, an inner cover made of terminal conductivity material and located outside the refractory block member, a cooling means located outside the inner cover, an outer cover made of thermal conductivity material and located outside the cooling means, a terminal electrically connected to each of ends of the heating element for supplying electric power thereto, and left substantially free from said inner cover, and a power supply electrically connected the terminal, and supplied electric power to said heating element.

The refractory block member is made by mixing ceramic fibers made of SiC or $Al_2O_3$ with a refractory material such as alumina cement. The turn pitch of each of the coil heaters is adjusted every zone and both ends of each of the coil heaters are connected to the terminals. The coil heaters are embedded in the refractory material, which is not baked yet, so as to project that end portion of each of the terminals, to which one end of each of the coil heaters is not connected, outside the outer cover and the refractory material thus prepared is then baked. The terminals are passed through small holes or openings of the inner cover, and fixed to the outer cover. In short, the terminals are left substantially free from the inner cover.

It is preferable that the inner and outer covers are separated from each other by a sufficient space and it is also desirable that the temperature of the outer cover is not made higher than at least 200° C.

It is preferable that the outer cover is made of metal having a linear expansion coefficient as small as possible and a light weight. It is desirable in this case that a plate of aluminium alloy or stainless steel, 1-3 mm thick, is used as the inner and outer covers. Further, it is desirable that a plate of aluminium alloy or stainless steel, 3-20 mm thick, is used as a flange attached to the lower open end portion of a furnace.

BRIEF DESCRIPTION OF THE DRAWINGS

FIG. 4 is a longitudinal sectional view showing the furnace in the heating apparatus partly sectioned;

FIG. 10 is a simulation isothermal chart showing simulate heat calculation results at the vertically-sectioned area of another heating furnace wall;

FIG. 11 is a view showing temperature characteristic at each zone in the heating apparatus according to the present invention;

DETAILED DESCRIPTION OF THE PREFERRED EMBODIMENTS

Various embodiments of the present invention will now be described with reference to the accompanying drawings.

Figure 1:
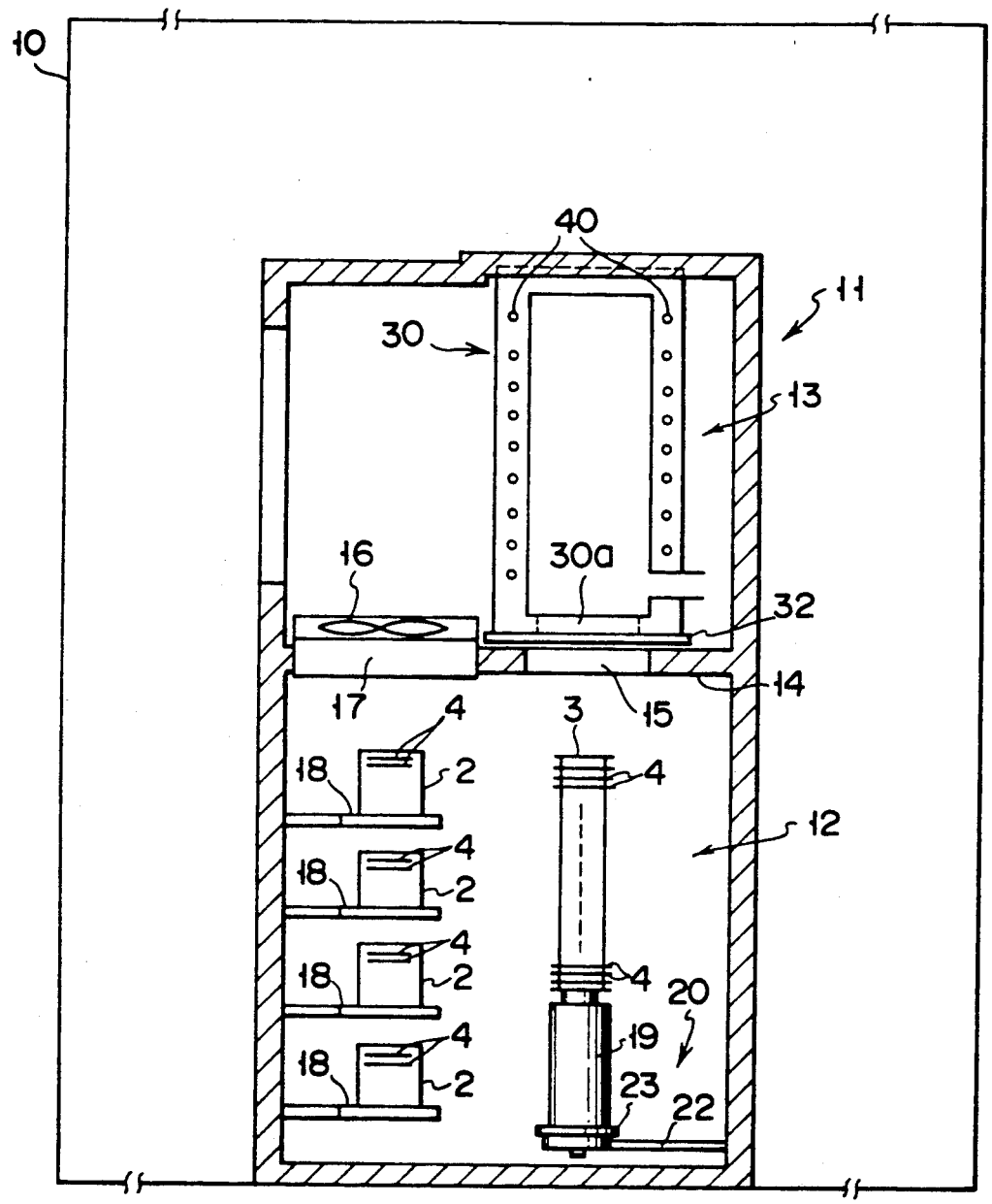
FIG. 1a is longitudinal sectional view roughly showing the whole of the heating apparatus (or vertical-type CVD apparatus) according to an embodiment of the present invention.

As shown in FIG. 1, a vertical-type CVD apparatus 11 is installed in a clean room 10 and its operation is automatically controlled by a computer system. Rails (not shown) for the handling robot are arranged on its front face and wafer cassettes 2 are carried into a wafer transfer section 12 in it.

A process section 13 is located above the wafer transfer section 12 in the vertical-type CVD apparatus 11. The process section 13 and wafer transfer section 14 are communicated with each other through an opening 15. A fan 16 having a filter 17 is attached to a partition wall 14 between the process section 13 and wafer transfer section 12.

Cassette stations 18 and a boat loading system 20 are arranged in the wafer transfer section 12. Cassette stations 18 comprise a plurality of shelves, on each of which plural wafer cassettes 2 are mounted.

A furnace 30 is located just above the opening 15 of the partition wall 14 in the process section 13. A lower opening 30a of the furnace 30 is communicated with the opening 15.

Figure 2:
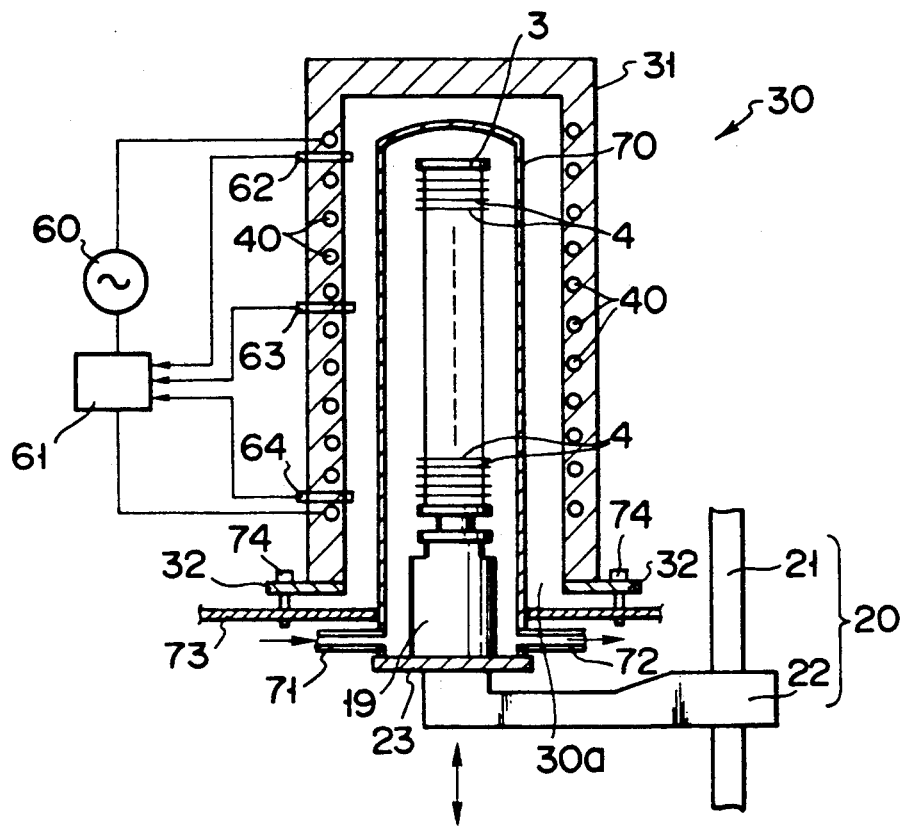
FIG. 2 is a sectional view showing the part of a furnace in the heating apparatus.

As shown in FIG. 2, coil heater 40 is embedded in a refractory wall 31 of the furnace 30. The coil heater 40 may be used as a resistance heating element or a high-frequency heating element. A process tube 70 is arranged in the furnace 30 while being encircled by the coil heaters 40. A lower opening of the process tube 70 is closed by a cap member 23 while wafers are being processed in the furnace 30. A heat insulating cylinder 19 is mounted on the cap member 23 and a vertical-type boat 3 is further mounted on the heat insulating cylinder 19. A plurality of semiconductor wafers 4 are loaded on the boat 3.

The cap member 23 is supported by a member 22 of the boat loading system 20 and the nut of the support member 22 is screwed into a ball screw 21.

A flange 32 is attached to the lower open end of the refractory furnace wall 31. The flange 32 and the lower end portion of the process tube 70 are fixed to a base 73 by means of bolts 74.

Gas supply and discharge pipes 71 and 72 are attached to the lower end portion of the process tube 70, thereby allowing process gas which consists of predetermined constituents to be supplied into and discharged out of the process tube 70.

Figure 3:
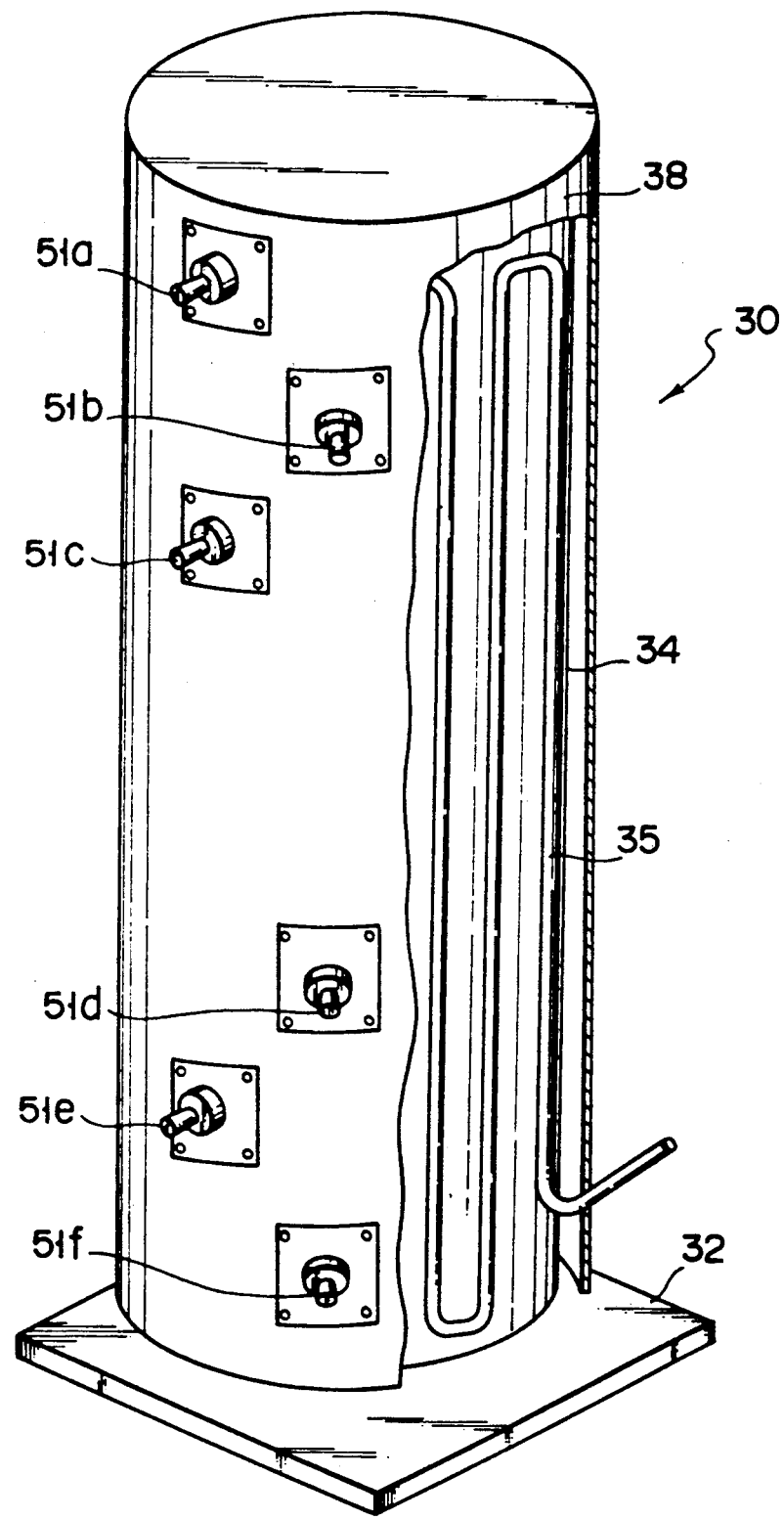
FIG. 3 is a perspective view schematically showing the furnace in the heating apparatus.

As shown in FIG. 3, the outer circumference of the furnace 30 is encircled by double covers 34 and 38 made of thermal conductivity material like, metal. A cooling pipe 35 made of copper is arranged to zigzag on the outer surface of the inner cover 34. The cooling pipe 35 is communicated with a cooling water resource (not shown) and a predetermined amount of cooling water is supplied through the cooling pipe 35.

Three pairs of six terminals 51a–51f are projected outside from the outer surface of the outer cover 38 and each pair of these paired terminals 51a and 51b (first zone), 51c and 51d (second zone) and 51e and 51f (third zone) is connected to a power supply 60. The coil heater 40 comprises at least three zones as described above.

As shown in FIG. 3, the first zone, about 100 mm high, is formed between the terminals 51a and 51b. The second zone, 750 mm high, is formed between the terminals 51c and 51d. The third zone, 150 mm high, is formed between the terminals 51e and 51f. Each of the terminals 51a–51f is connected to the AC power supply 60.

As shown in FIG. 2, thermocouples 62, 63 and 64 which serve as temperature measuring elements are arranged in the first, second and third zones. Each of the thermocouples 62, 63 and 64 is connected to the input side of a controller 61. The amount of current supplied from the power supply 60 to each zone is controlled by the controller 61. The amount of current supplied to each of the first, second and third zones can be controlled in this manner to make the uniform temperature area as large as possible in the heating apparatus.

As shown in FIG. 4, the wall of the furnace 30 is formed by three layers of matter comprising a layer of a refractory block 31, a layer of an insulation 33 and a layer of air 39a. The top of the furnace 30 is covered by a thick refractory block 55, which is further covered by a stainless steel plate 56. The bottom of the furnace 30 is made open and a flange 32 made by a stainless steel plate is attached to the open bottom end.

Holding grooves 58 are formed in the inner wall of the refractory block 31 and the coil heaters 40 are fitted or embedded in the holding grooves 58. The refractory block 31 is shaped like a cylinder having a height of about 1000 mm and an inner diameter of about 350 mm, and it is made by mixing ceramic fibers and alumina cement, and baking this mixture.

The insulation 33 is made by an alumina blanket and inserted between the refractory block 31 and the inner cover 34. The lower end of the inner cover 34 is fixed to the lower flange 32 by a ring-shaped support 36a. The top of the inner cylinder 34 is separated from the top of the furnace 30 by a space 39b and left free.

A top of outer cover 38 is fixed to the top of the furnace 30 by a spacer ring 37 made of stainless steel. The lower end of the outer cover 38 is attached to the lower flange 32 by a ring-shaped support 36b. The air layer 39a is thus formed between the inner and outer covers 34 and 38. The outer cover 38 is provided with those openings through which the terminals 51a–51f are introduced outside.

Figure 5:
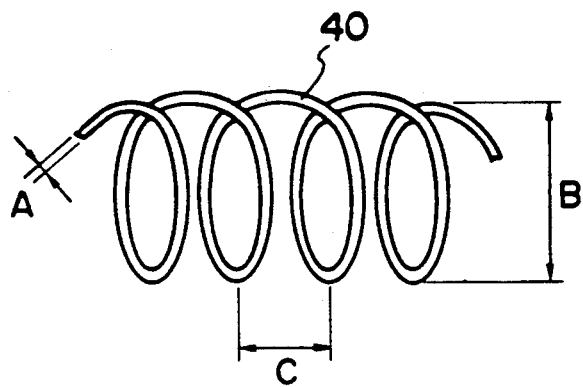
FIG. 5 is a perspective view showing a part of a coil heater.

Each of the coil heaters 40 is a coil-shaped resistant heating element made of an Fe-Cr-Al alloy. As shown in FIG. 5, has an element diameter A of 2 mm, a winding diameter B of 12 mm and a winding pitch C of 9.5 to 10 mm. A coil-shape of element 40 is coiled like a circle but it may be coiled like an oval or in any shape if it is shaped like a ring.

Figure 6:
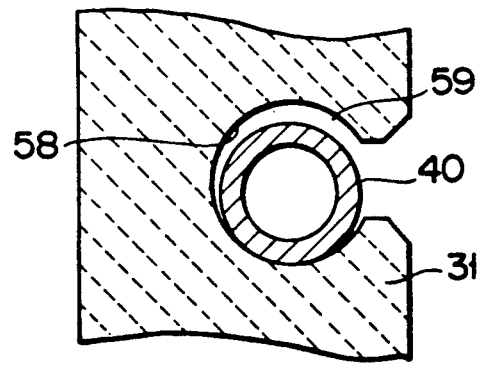
FIG. 6 is a transverse sectional view showing the coil heater in the refractory wall sectioned perpendicular to the axis of the coil heater.

As shown in FIG. 6, each of the coil heaters 40 is held in the holding groove 58, keeping a certain space 59 between the inner surface of the refractory block 31 and it, when the furnace is not used. This space 59 is formed on its upper half to absorb its heat expansion when the furnace is used.

Figure 7:
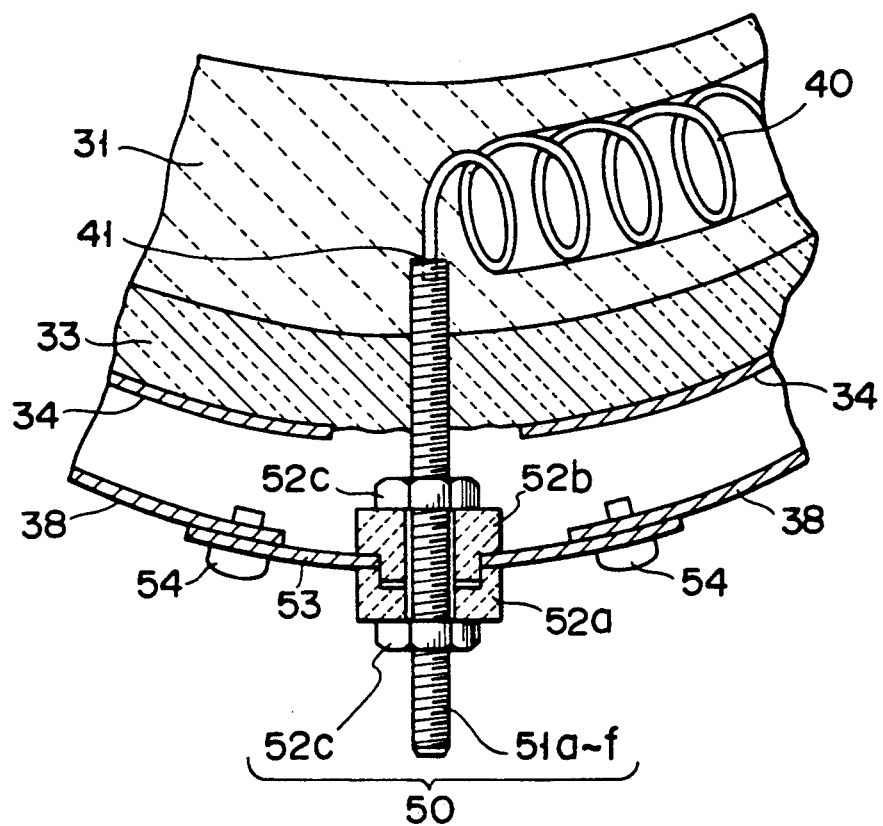
FIG. 7 is a transverse partial sectional view showing that portion of the coil heater to which a power supply terminal is attached.

As shown in FIG. 7, each end of each coil heater 40 is inserted into the base end of its corresponding one of the terminals 51a–51f at a current supply terminal section 50 and welded there. A terminal connector 41 is previously formed at each end of each coil heater 40 and each coil heater 40 having these terminals at both ends thereof is embedded in the refractory block 31 before baking. Each of the terminals 51a–51f is made of material the same as or similar to that of the coil heaters 40 and has a diameter of 6 mm, for example, larger than that of the coil heaters 40.

Each of the terminals 51a–51f is projected outside the outer cover 38, passing through the opening of the inner cover 34. An auxiliary plate 53 is attached to the outer cover 38 by four screws 54 so as to close the terminal opening of the outer cover 38. A screw thread is formed o each of the terminals 51a–51f. A pair of insulators 52a and 52b are attached to the auxiliary plate 53, holding it between them, and each of the terminals 51a–51f is insulated from the outer cover 38 by them. Nuts 52c are further attached to these paired insulators 52a and 52b, holding the insulators between them. These nuts 52c are screwed onto each of the terminals 51a–51f to fasten the insulators 52a and 52b. Each of the terminals 51a–51f is therefore fixed to the outer cover 38 and left free from the inner cover 34 at the current supply terminal section 52.

Figure 8:
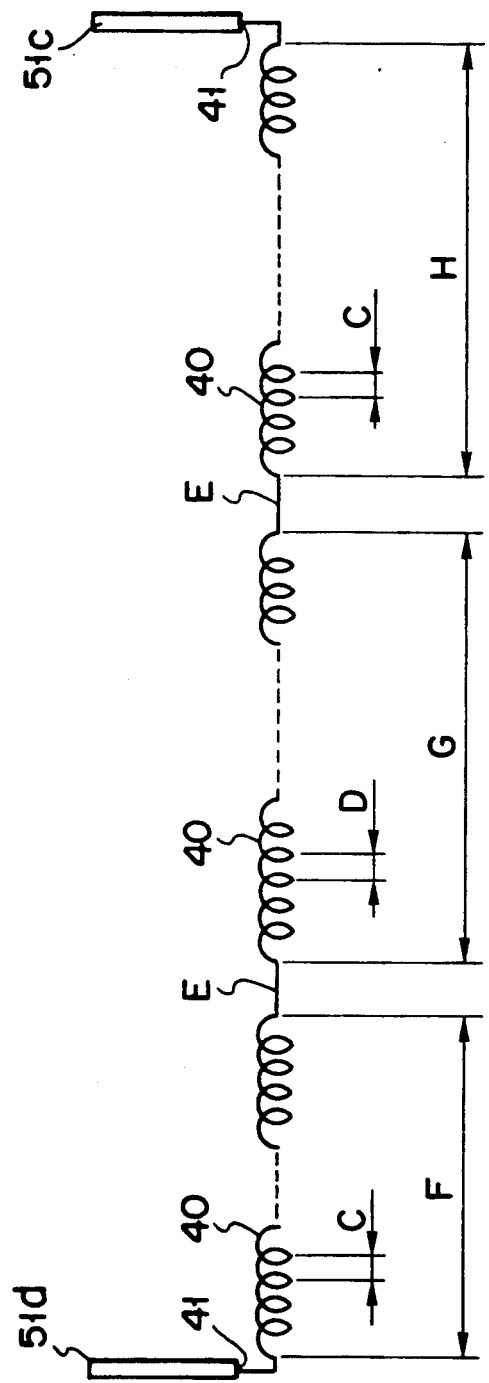
FIG. 8 is a view schematically showing a whole arrangement of the coil heater.

FIG. 8 shows the coil heater 40 which forms the second zone between its terminals 51c and 51d before it is embedded in the wall of the refractory block 31. Its turn pitch C is made 10 mm at a zone F (located on the side of its terminal 51c) and a zone H (located on the side of its terminal 51d) but its turn pitch D is made 9.5 mm at an intermediate zone G to make its heating density higher by about 5% than at the zones F and H. Those portions E of the coil heater 40 whose turn pitch is changed between the zones F and G and between G and H are made linear. The coil heater 40 can be easily set to have a predetermined length at each of the zones F, G and H, considering its linear portions E. When the heating element is coiled to have a predetermined windings and then pulled by a predetermined length at each of the zones F, G and H, each of the turn pitches C and D can be easily set.

A case where the uniform temperature zone is heated to about 900° C. while circulating cooling water of 20° C. through the cooling pipe 35 of the above-described heating apparatus 30 will now be described.

The wafer boat 3 is loaded into the process tube 70 and a predetermined process gas is supplied to and discharged out of the process tube 70. Supply and discharge of the process gas are thus balanced to each other to create desired pressure in the process tube 70. Temperatures at the first, second and third zones are detected by the thermocouples 62, 63 and 64 while supplying current to the coil heaters 40 at these zones. Current applied to the coil heaters 40 at the zones is controlled responsive to the temperatures detected. The uniform temperature zone in the heating apparatus 30 can be thus set a temperature range of 900° C.±1° C.

Temperatures of the refractory block 31, the inner and outer covers 34 and 38, and the lower flange 32 are detected by temperature detectors (not shown). These temperatures detected were inputted into a heat analysis program and the distribution of temperatures at the lower portion 30a of the apparatus was calculated.

Figure 9:
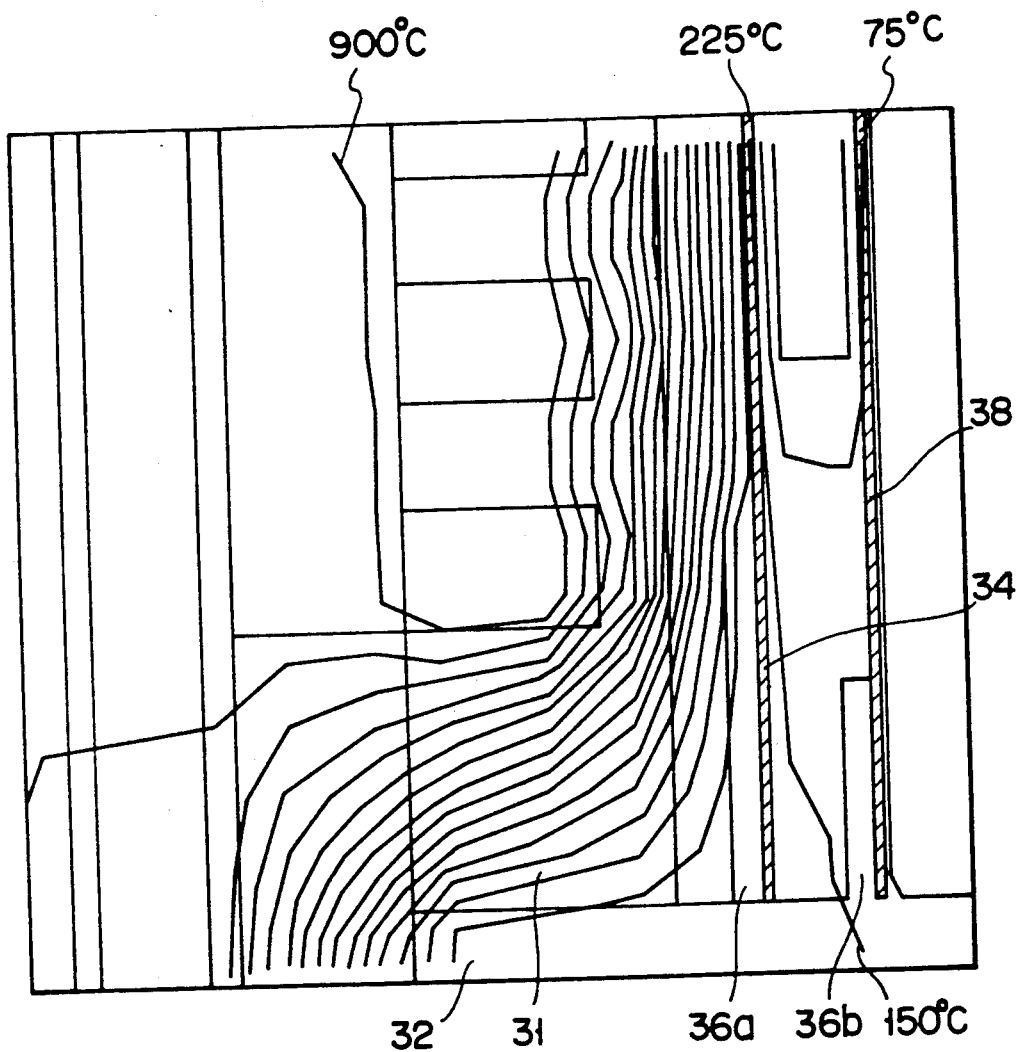
FIG. 9 is a simulation isothermal chart showing simulate heat calculation results at the longitudinal-sectioned area of a heating furnace wall.

FIG. 9 shows results of the temperature distribution calculated by a computer in a case where both of the inner and outer covers 34 and 38 are made of aluminium alloy plate. According to these results, the inner wall of the refractory block 31 was about 900° C., the inner cover 34 about 225° C., the outer cover 38 about 75° C. and the lower flange 32 about 150° C.

To add more, the temperature of the top plate 56 of the apparatus 30 is about 100° C. The reason why the temperature of the lower flange 32 becomes higher than that of the stainless steel plate 56 is that the lower flange 32 is heated by heat radiated from the process tube 70. It is needed that the lower flange 3 is kept lower than 200° C. and that it is attached to the base plate 73 to transmit its heat through the base plate 73 not to unnecessarily heat those portions in the apparatus 30 which are low in heat-proof.

FIG. 10 shows results of the temperature distribution calculated by the computer in another case where both of the inner and outer covers 34 and 38 are made of stainless steel plate. The refractory block 31 was about 900° C., the inner cover 34 about 200° C., and the outer cover 38 about 50° C. These temperatures were a little lower than in the first case but the temperature (about 200° C.) of the lower flange 32 became higher by The difference between the results shown in FIG. 9 and those shown in FIG. 10 is caused by that the amount of heat radiated from the lower flange 32 to the inner and outer covers 34 and 38 due to heat conduction changes because the heat conductivity of aluminium is 200 W/mK, higher than that of stainless steel which is 16 W/mK.

The elongation of each of the refractory block 31, the inner cylinder 34 and the outer cylinder 38 was calculated in a case where their length was set to 1000 mm and the refractory block 31 was heated from room temperature to 900° C.

It was assumed in this case that the linear expansibility of the refractory block 31 be $0.5 \times 10^{-6}$/° K. and that the one of aluminium alloy be $16 \times 10^{-6}$/° K. The elongation of the refractory block 31 (at a temperature of 900° C.) becomes 0.45 mm, that of the inner cylinder 34 (at a temperature of 225° C.) 3.6 mm, and that of the outer cylinder 38 (at a temperature of 75° C.) 1.2 mm. As apparent from these values, the elongation of the inner cover 34 becomes remarkably larger, as compared with those of the refractory block 31 and the outer cover 38, but the difference between those of the outer cover 38 and the refractory block 31 is small (0.75 mm). Thermal stress added to the connecting sections 41 at which the coil heaters 40 are connected to the terminals 51a–51f at their ends is therefore small. Even when current supply is stopped and started many times, therefore the terminals 51a–51f are not separated from the ends of the coil heaters 40 at the connecting sections 41, so that a more stable heat process can be carried out for a long time. Further, the space 39b is formed between the upper end of the inner cover 34 and the ceiling member 37. This prevents the inner cover 34 from colliding with the ceiling member 37 and the whole of the apparatus from being abnormally deformed.

FIG. 11 is a composed view showing temperature distribution in the process tube 70 of the above-described apparatus. A curve J represents how temperature changes from a reference value of 900° C.±1° C. in the longitudinal direction of the process tube 70. As apparent from the curve J, the length of the uniform temperature range became 770 mm and all of the second zone was in the uniform temperature area when temperature irregularities in the uniform temperature area of the process tube 70 were in the value of 900° C.±1° C.

Figure 12:
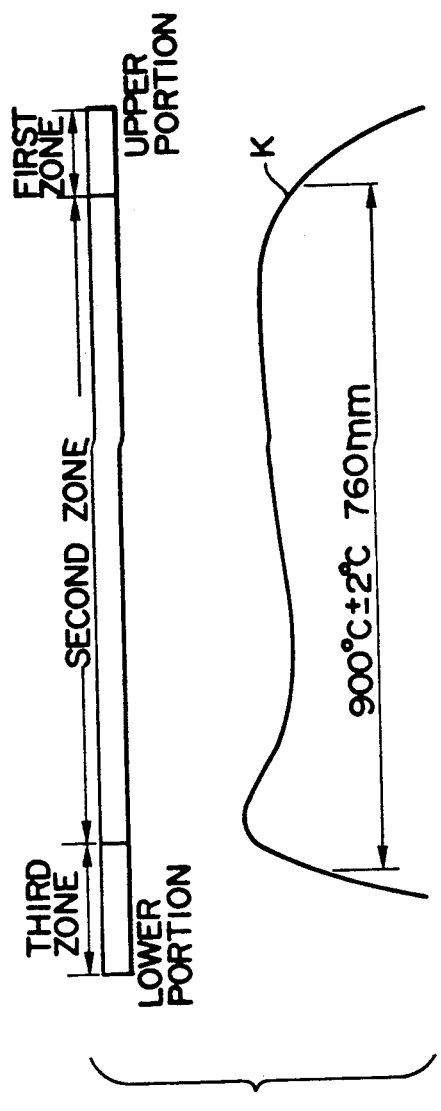
FIGS. 12 and 13 are views each showing temperature characteristic at each zone in the conventional heating apparatus.

FIG. 12 is a composed view showing temperature distribution in the process tube of the conventional heating apparatus. A curve K represents how temperature changes from a reference value of 900° C.±2° C. in the longitudinal direction of the process tube. The turn pitches of the coil heaters were all made 10 mm at the first zone (or upper portion of the tube), the second zone (or intermediate portion of the tube) and the third zone (or lower portion of the tube). As apparent from the curve (K), the length of the uniform temperature area in the process tube became 760 mm when temperature irregularities in the uniform temperature area of the process tube were in the value of 900° C.±2° C.

Figure 13:
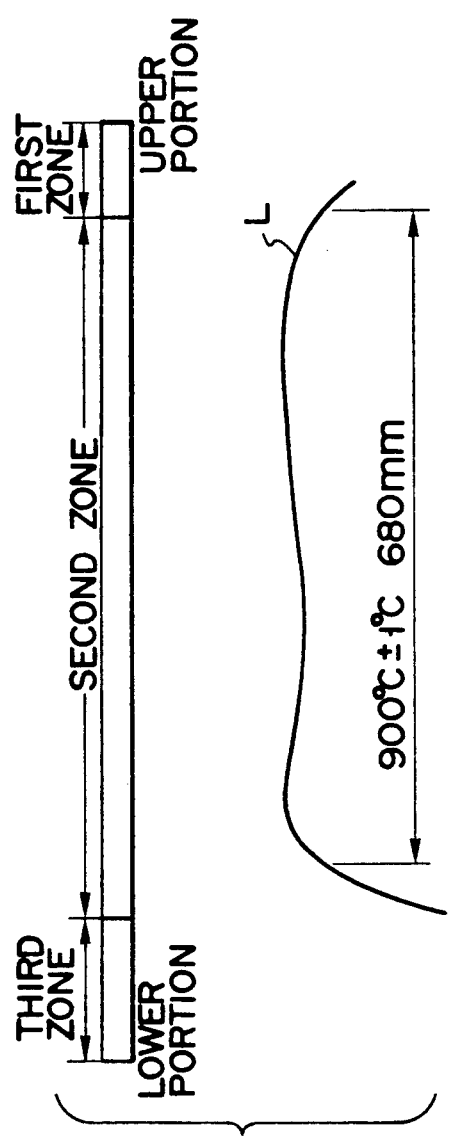

FIG. 13 is a composed view showing temperature distribution in the conventional process tube from a different viewpoint but under the same conditions as in FIG. 12. A curve L represents how temperature changes from the reference value of 900° C.±1° C. in the longitudinal direction of the process tube. As apparent from this curve L, the length of the uniform temperature area in the process tube became 680 mm, shorter than those in the above-described two cases, when temperature irregularities in the uniform temperature area of the process tube were in the value of 900° C.±1° C.

Figure 14:
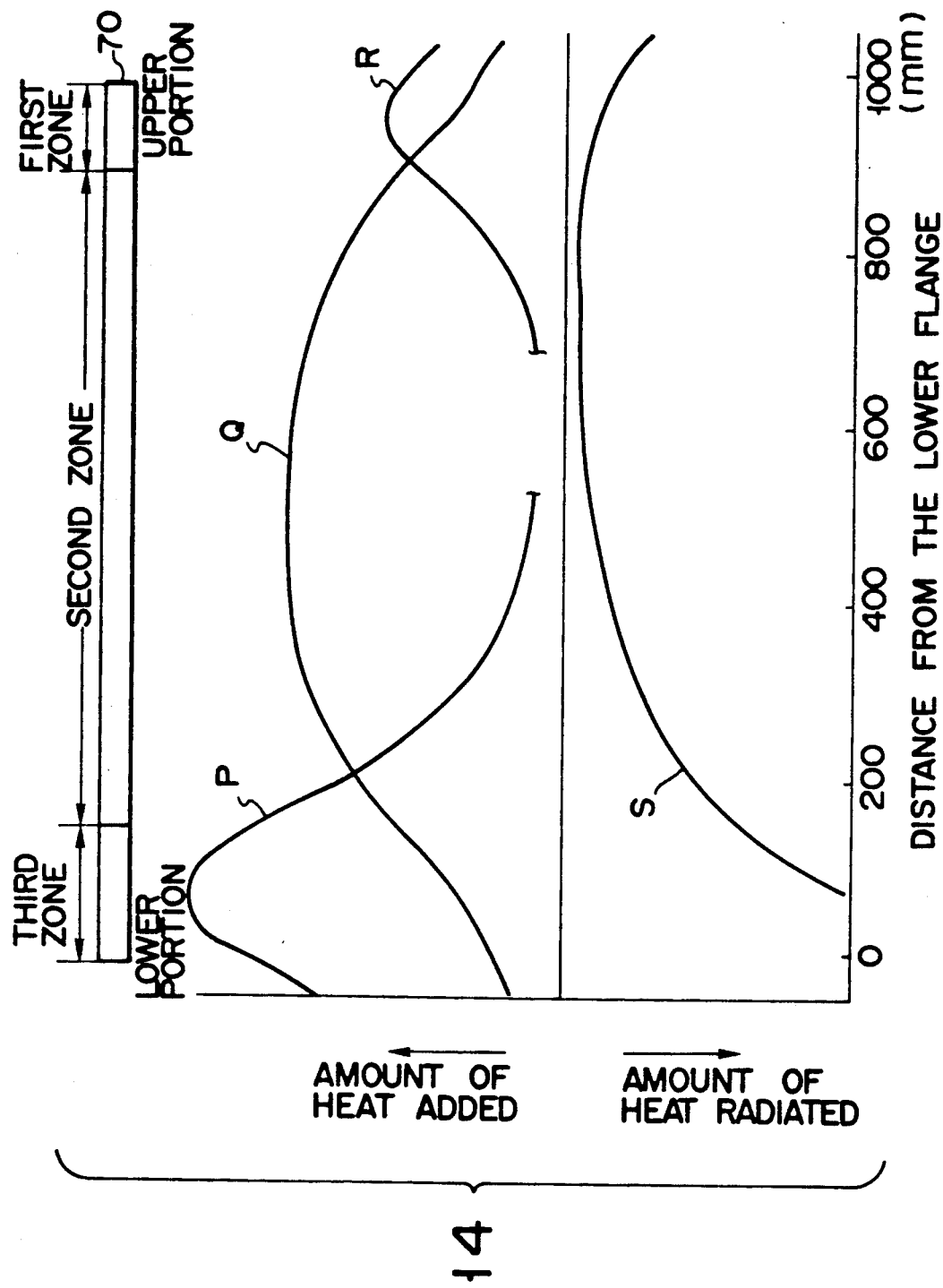
FIG. 14 is a view showing amounts of heat added and radiated at each zone in the heating apparatus according to the present invention.

Referring to FIG. 14, the reason why temperature remarkably changes at each of the zones (particularly at the second zone) in the process tube when the turn pitches of the coil heaters are made the same all over the length of the apparatus will be described.

As shown by a curve (S) in FIG. 14, the amount of heat loss downward becomes considerably larger than the amount of heat loss upward in the case of the heating apparatus which has an opening at the bottom thereof. In order to solve this, the amount of heat added at the third zone (which is denoted by a curve P) is made larger than those at the other zones (which are represented by curves Q and R) to compensate the amount of heat loss from the lower portion of the apparatus. In the case of the manner of compensating a large amount of heat loss by a large amount of heat added, however, it is quite difficult to control temperature and temperature irregularities at each of the zones in the process tube cannot be completely eliminated.

In the case of the above-described apparatus according to the present invention, however, the turn pitch of the coil heater at the intermediate zone G of the second zone is made smaller than those at the other zone F and H thereof to make the amount of heat added at the zone G larger by about 5% than those at the zones F and H, as shown in FIG. 8. As shown in FIG. 11, excellent uniform heating characteristic can be thus obtained all over the length of the second zone.

The position of the zone G where the uniform temperature area can be made longer and the heating density can be made higher, and the rate of the turn pitches C and D of the coil heaters can be variously changed depending upon the length and diameter of the heat processing furnace, the process tube attaching manner, the flow rate of process gas and others.

According to the above-described embodiment of the present invention, the refractory block 31 in which the coil heaters 40 are embedded is made of simply-shaped ceramics. Therefore, the manufacturing cost of the apparatus can be made lower and the time needed to make the apparatus can be made shorter.

According to the above-described embodiment, the outer cover 38 and the lower flange 32 are naturally cooled. Therefore, it is not necessary to forcedly cool the whole of the heating furnace 30, and the CVD apparatus can be made smaller in size and simpler in structure.

This natural cooling enables insulation resistance between the coil heaters 40 and the outer cover 38 and between the coil heaters 40 and the lower flange 32 to be made higher. The reason will be described below.

These insulation resistances depend largely upon temperature. They become high or several hundreds mage-ohms at room temperature, for example, but when the refractory block 31 is heated to a temperature of 800°-900° C., they are reduced low or several hundreds kilo-ohms. In the case of the above-described embodiment, that portion (or outer circumference) of the refractory block 31 with which the inner cover 34 is contacted is about 200° C. in temperature.

Further, that portion of the refractory block 31 with which the lower flange 32 is contacted is about 400° C. in temperature and the insulation resistances become larger than 2 mega-ohms. Providing that the supply of cooling water to the cooling pipe 35 is stopped, the temperature of the refractory block 31 is raised and the insulation resistances are decreased to several hundreds kilo-ohms. In order to further increase the insulation resistances at the lower portion of the apparatus, therefore, it is necessary that the temperature of the opening 30a is lowered.

Figure 15:
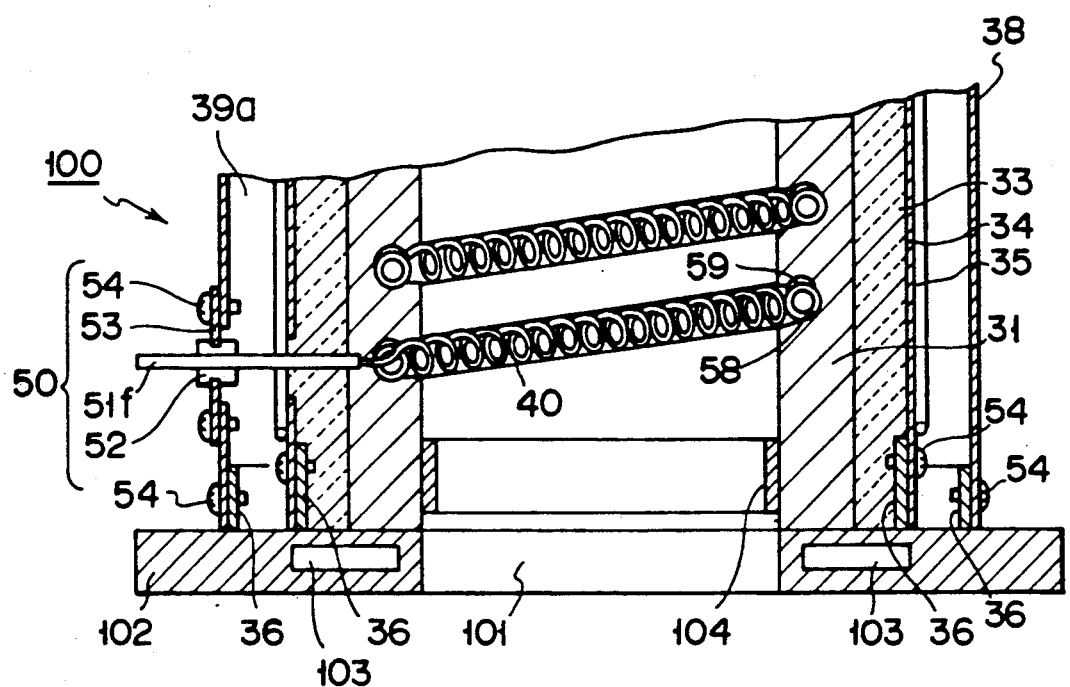
FIG. 15 is a longitudinal sectional view showing a lower portion of the heating apparatus according another embodiment of the present invention, in which the lower flange at the open end of the furnace is changed.

When a lower flange 102 of a furnace 100 is made as being of the water cooling jacket type and the lower portion of the furnace is forcedly cooled, as shown in FIG. 15, the insulation resistances can be increased. In short, it may be arranged that a passage 103 is formed in the lower flange 102 and that cooling water is passed through the passage 103. Further, a ring-shaped member 104 made of material such as SiC and Al$_2$O$_3$ which have heat-proof and light shield may be located adjacent to an opening 101 to attenuate heat radiated from the coil heaters to the opening 101.

When arranged in this manner, temperature can be reduced to about 200° C. in the vicinity of the opening 101. The insulation resistances at the lower portion of the furnace can be thus made larger than 10 mega-ohms, thereby effectively preventing an accident from being caused by current leakage.

Figure 16:
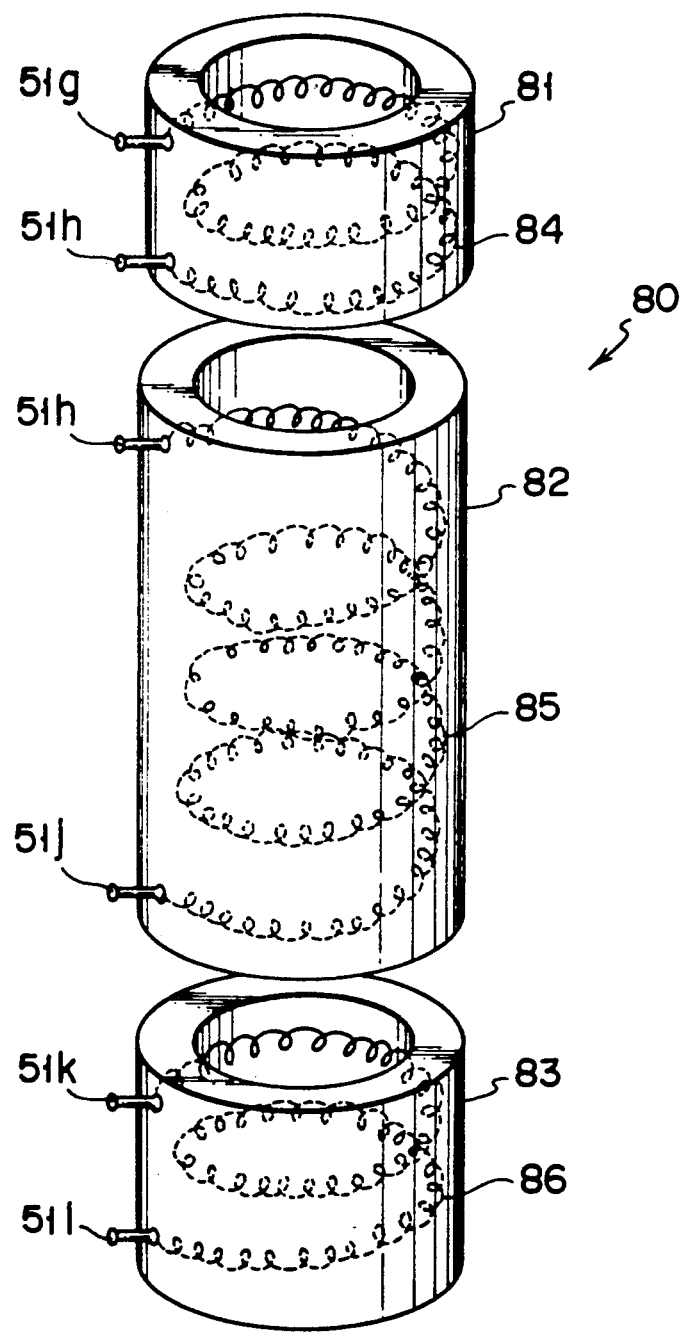
FIG. 16 is a perspective view showing the heating apparatus according to a further embodiment of the present invention dismantled.

As shown in FIG. 16, a furnace body 80 comprising plural heating blocks 81, 82 and 83 may also be employed. It is not arranged that the refractory block 31 in which the coil heaters 40 are embedded is formed as a unit to form the furnace body as seen in the case of the above-described embodiments, but it may be arranged that the three heating blocks 81, 82 and 83 are coaxially combined with one another to form the furnace body 80. A coil heater 34 embedded in the heating block 81 forms the first zone in the heating section in this case. Further, a coil heater 85 embedded in the heating block 82 forms the second zone in the heating section and a coil heater 86 embedded in the heating block 83 forms the third zone in the heating section. Both ends of these coil heaters 84, 85 and 86 are connected to their corresponding paired terminals 51g, 51h; 51i, 51j and 51k, 51l, respectively. The arrangement of each, of their current supply terminal sections is substantially the same as those in the above-described embodiments.

Figure 17:
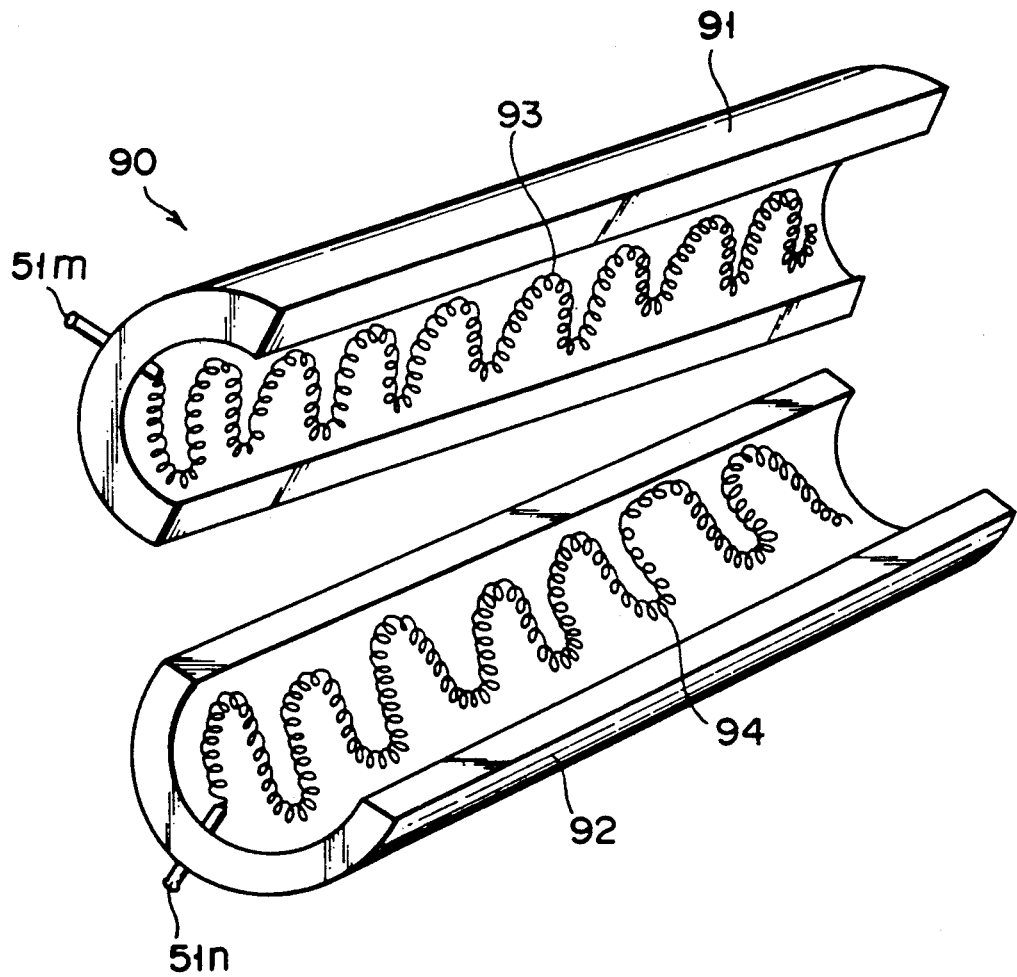
FIG. 17 is a perspective view showing the heating apparatus according to a still further embodiment of the present invention dismantled.

As shown in FIG. 17, a furnace body 90 comprising a pair of heating cylinder halves 91 and 92 may also be employed. Coil heaters 93 and 94 are embedded to zigzag in their corresponding cylinder halves 91 and 92 and terminals 51m and 51n are connected to one ends of them.

Figures 18, 19:
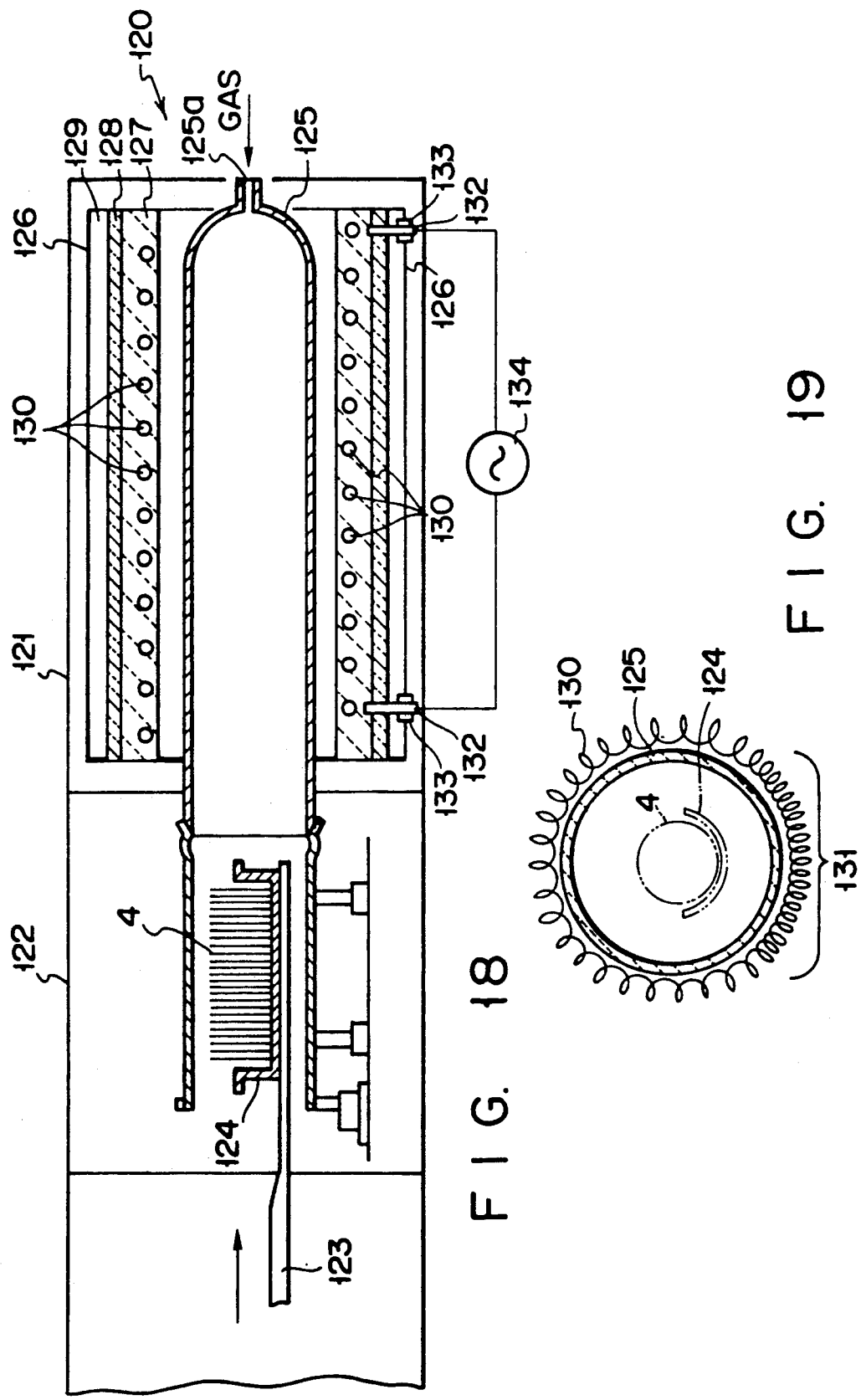
FIG. 18 is a longitudinal sectional view showing the heating apparatus (or horizontal-type CVD apparatus) according to a still further embodiment of the present invention.
FIG. 19 is a transverse sectional view schematically showing the heating section in the heating apparatus (or horizontal-type CVD apparatus) according to a still further embodiment of the present invention.

A heating apparatus 126 according to the present invention may also be used as a horizontal-type CVD apparatus 120, as shown in FIG. 18. The horizontal-type CVD apparatus has furnace and scavenger chambers 121 and 122, and a wafer boat 124 is carried from the scavenger chamber 122 into a process tube 125 by a loading fork 123. The process tube 125 has an inlet 125a at the deepest end thereof, through which process gas is supplied to the process tube 125.

A heat processing means 126 encloses the process tube 125 in the furnace chamber 121. The furnace body of the heat processing means 126 is of the three-layer type. An inner layer 127 is a refractory block made by mixing ceramic fibers with alumina cement, and a coil heater 130 wound in a spiral at a predetermined pitch is embedded in the inner layer 127. The coil heater 130, terminals 132, insulators 133 and a power source 134 are arranged substantially in the same manner as in the case of the above-described first embodiment of the present invention.

An intermediate layer 128 is made by a heat insulating member such as an alumina blanket. An outer layer 129 is an adiabatic air layer formed between two metal covers. The inner and outer metal covers are arranged substantially in the same manner as in the above-described first embodiment.

As shown in FIG. 19, that lower portion of the coil heater 130 has a turn pitch greater than that of the other portion thereof. When arranged in this manner, the lack of the amount of radiated heat loss which is shielded by the fork 123 and the boat 124 can be compensated to make uniform the temperature of the semiconductor wafers 4 in the process tube 125.

The heating apparatus of the present invention can be applied to an oxidation diffusing apparatus and a plasma apparatus as well as to the CVD apparatus which is used in the semiconductors and liquid crystals manufacturing apparatuses. According to the heating apparatus of the present invention, a more stable heat process can be carried out for long time without damaging current supply and breaking any of the lines through which current is supplied, even when temperature raising and lowering are frequently repeated.

Even when temperature is set high in the heating apparatus, the outer wall and opening of the furnace can be kept lower in temperature to thereby prevent insulation resistances from being lowered to a great extent. This makes it unnecessary to make the insulating members thick and large in size, so that the whole of the apparatus can be smaller-sized. In addition, the apparatus can be made simpler in structure, thereby enabling its cost to be made lower and its manufacturing time to be made shorter.

Further, current leakage can be reduced to prevent other machines and measuring means from being wrongly affected by ground noise current.

Furthermore, when the turn pitch of the coil heater is changed every heating zone, temperature irregularities can be made less at each of the heating zones and the length of the uniform temperature zone can be made longer.

What is claimed is:
1. A heating apparatus comprising:
 a refractory block member enclosing objects to be processed;
 a heating element which is embedded in said refractory block member and formed in a spring coiled shape, having a diameter less than the thickness of said refractory block member;
 an inner cover made of a metallic material and located outside said refractory block member;
 a cooling means located outside said inner cover;
 an outer cover made of a metallic material and located outside said cooling means;
 a terminal which is electrically connected to an end portion of said heating element for supplying electric power to said heating element, and which passes through said inner cover and said outer cover, said terminal being fixed to said outer cover through an insulating member and left free from said inner cover; and
 a power supply electrically connected to said terminal, and for supplying electric power to said heating element.

2. The heating apparatus according to claim 1, further comprising, a flange made of thermally conductive material and connected to an open end of the refractory block to transmit heat to both of the inner and outer covers.

3. The heating apparatus according to claim 2, wherein said flange is made of aluminium alloy.

4. The heating apparatus according to claim 2, wherein said flange is made of stainless steel.

5. The heating apparatus according to claim 1, wherein said inner and outer covers are made of aluminium alloy.

6. The heating apparatus according to claim 1, wherein said inner and outer covers are made of stainless steel.

7. The heating apparatus according to claim 1, wherein a coil pitch of each of said heating elements can be changed in each of heating zones in a heat processing section.

8. The heating apparatus according to claim 7, wherein said heat processing section includes first, second and third heating zones arranged in series, said heating element has three coils located in the first, second and third heating zones, and the second coil has a turn pitch greater than that of the first and third coils.

9. The heating apparatus according to claim 1, further comprising a heat insulating member arranged between the inner cover and the refractory block member.

10. The heating apparatus according to claim 1, wherein the diameter of each of said heating elements is smaller than that of each of said terminals.

11. The heating apparatus according to claim 1, wherein a control means is connected to the power supply to control the amount of electric power supplied to the heating element.

12. The heating apparatus according to claim 11, further comprising a temperature detecting sensor provided in every zone in the heat processing section and these sensors are connected to the control means.

13. The heating apparatus according to claim 1, wherein said terminal is embedded in said refractory block member.

14. A vertical-type CVD apparatus comprising:
 a refractory block member embedded in a spring coil-shaped resistant heating element enclosing objects to be processed, said refractory block member having an opening at the lower end thereof;
 the coil diameter of said heating element being less than the thickness of said refractory block member;
 a process tube enclosed by said resistant heating element, keeping its longitudinal axis vertical;
 an inner cover made of a metallic material, and located outside said refractory block member;
 a cooling means located outside said inner cover;
 an outer cover made of a metallic material, and located outside said cooling means;
 a terminal which is electrically connected to an end portion of said heating element for supplying electric power to said heating element, and which passes through said inner cover and said outer cover, said terminal being fixed to said outer cover through an insulating member and left free from said inner cover; and a power supply electrically connected to said terminal, for supplying electric power to said heating element.

* * * * *